United States Patent
Kumar et al.

(10) Patent No.: US 11,901,865 B2
(45) Date of Patent: Feb. 13, 2024

(54) LOW POWER CRYSTAL OSCILLATOR

(71) Applicant: STMicroelectronics International N.V., Geneva (CH)

(72) Inventors: Anand Kumar, Noida (IN); Nitin Jain, Ghaziabad (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 17/931,863

(22) Filed: Sep. 13, 2022

(65) Prior Publication Data
US 2023/0090782 A1 Mar. 23, 2023

Related U.S. Application Data

(60) Provisional application No. 63/246,026, filed on Sep. 20, 2021.

(51) Int. Cl.
*H03B 5/06* (2006.01)
*H03B 5/36* (2006.01)

(52) U.S. Cl.
CPC .............. *H03B 5/364* (2013.01); *H03B 5/06* (2013.01); *H03B 5/366* (2013.01); *H03B 2200/0082* (2013.01); *H03B 2200/0094* (2013.01)

(58) Field of Classification Search
CPC .............. H03B 5/06; H03B 5/30–368; H03B 2200/0082; H03B 2200/0094; H03K 3/014; H03L 3/00
See application file for complete search history.

(56) References Cited

U.S. PATENT DOCUMENTS

| | | | |
|---|---|---|---|
| 4,956,618 A * | 9/1990 | Ulmer | H03B 5/06 331/158 |
| 5,805,027 A | 9/1998 | Yin | |
| 6,784,757 B2 | 8/2004 | Sibrai et al. | |
| 7,098,753 B1 | 8/2006 | Dumitrescu et al. | |
| 7,262,671 B2 | 8/2007 | Maeder | |
| 7,688,154 B1 | 3/2010 | Fotouhi | |
| 8,922,287 B2 | 12/2014 | Vilas Boas et al. | |
| 9,461,584 B2 | 10/2016 | Mittal et al. | |
| 10,848,102 B2 | 11/2020 | Zhang | |
| 10,931,232 B2 | 2/2021 | van der Zee et al. | |
| 2009/0096541 A1 * | 4/2009 | Tran | H03B 5/06 331/116 R |
| 2011/0148533 A1 * | 6/2011 | Ramet | H03B 5/06 331/116 FE |
| 2012/0161889 A1 * | 6/2012 | Ozawa | H03B 5/364 331/116 FE |
| 2012/0326794 A1 * | 12/2012 | Kammula | H03B 5/362 331/15 |
| 2015/0214955 A1 * | 7/2015 | Calhoun | H03L 1/02 331/47 |
| 2017/0346442 A1 * | 11/2017 | Ito | H03B 5/366 |
| 2018/0054163 A1 * | 2/2018 | Chen | H03K 3/02315 |
| 2018/0109264 A1 * | 4/2018 | Kim | H03B 5/364 |
| 2021/0273610 A1 * | 9/2021 | Telstø | H03B 5/366 |

* cited by examiner

*Primary Examiner* — Levi Gannon

(74) *Attorney, Agent, or Firm* — Seed IP Law Group LLP

(57) ABSTRACT

A low power crystal oscillator circuit having a high power part and a low power part. Oscillation is initialized using the high power part. Once the crystal is under stable oscillation, the circuit switches to the low power part and continue operation for a long duration.

19 Claims, 7 Drawing Sheets

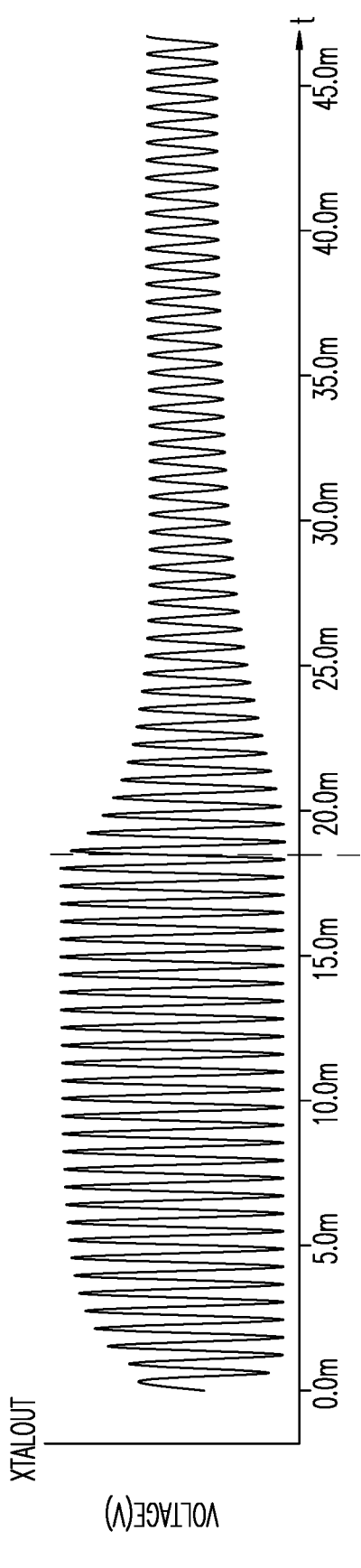
FIG. 4C
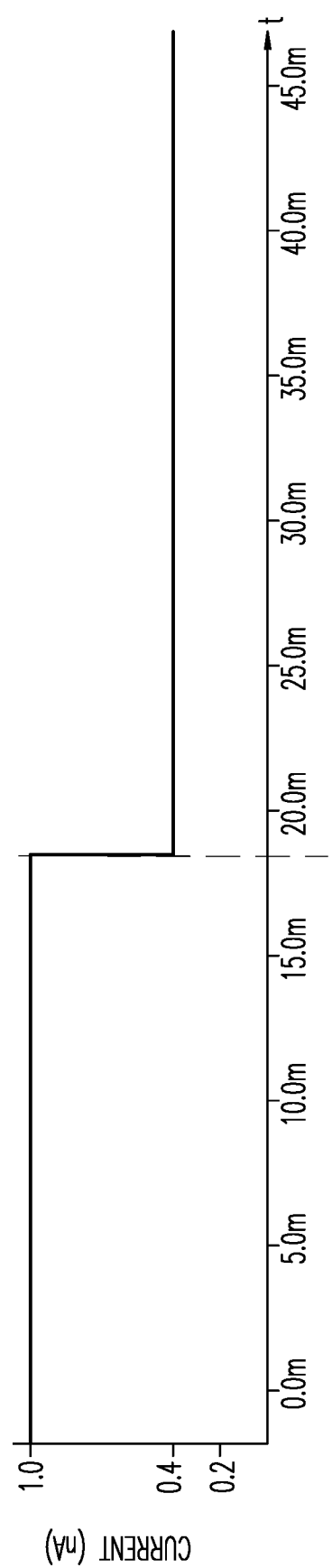
FIG. 4D1

FIG. 4D2

LOW POWER CRYSTAL OSCILLATOR

BACKGROUND

Technical Field

The disclosure relates to an electrical circuit that drives a crystal that outputs an oscillating signal, and in particular, a crystal circuit that has low power consumption while outputting stable frequency during long term operation.

Description of the Related Art

The present disclosure relates to crystal oscillator circuitry that is used in applications where having low power consumption is a priority. For example, some devices are battery powered and may be placed in remote locations for a long period of time. Even when in the sleep mode, the crystal oscillator will usually be outputting a stable frequency for those few circuits that operate in sleep mode.

Crystal oscillators operate by exciting a crystal through a harmonic circuit that usually comprises a resistor, a capacitor, and a transistor. Some circuits are also constructed to provide a negative resistance, while others operate based on different principles. For those that use negative resistance, it is established by the transconductance of the transistor. The more the transcondutance, the more stable the crystal oscillator operates. However, the more the transconductance, the more current the transistor consumes, and the more power the oscillator circuit consumes.

To reduce power consumption, a low transconductance is required to stably operate a crystal oscillator. However, as the power consumption goes lower, there is a smaller tolerance for errors and the circuit is more susceptible to failure.

BRIEF SUMMARY

A low power crystal oscillator circuit according to the current disclosure includes a crystal coupled with a resistor, first and second capacitors, and a first transistor forming an oscillator. The crystal is further coupled to a first set of current mirror transistors and a second set of current mirror transistors through a set of startup control transistors. The startup control transistors form an electrical switch allowing the crystal to be coupled with the first or second set of current mirror transistors. The startup control transistors are configured to receive a startup signal that will couple the crystal to the first set of current mirror transistors. The first set of current mirror transistors has a larger width to length ratio than the second set of current mirror transistors. The second set of current mirror transistors is further coupled to the crystal by a third capacitor. The current mirror transistors provide transconductance in addition to the first transistor to maintain stable oscillation of the crystal.

A method to operate a low power crystal oscillator includes sending a startup signal of a first polarity to a crystal oscillator circuit, maintaining the startup signal until the crystal reaches stable oscillation, and reversing the first polarity of the startup signal so the circuit operates with low power consumption. When the startup signal is at the first polarity, the crystal oscillator circuit is configured to operate with a high power consumption to initialize and maintain stable oscillation. Once the polarity of the startup signal is reversed, the crystal oscillator circuit switches to operate using low power.

BRIEF DESCRIPTION OF THE SEVERAL VIEWS OF THE DRAWINGS

FIG. 4A-4E are various operational parameters of the embodiments presented in FIGS. 2 and 3.

DETAILED DESCRIPTION

Figure 1:
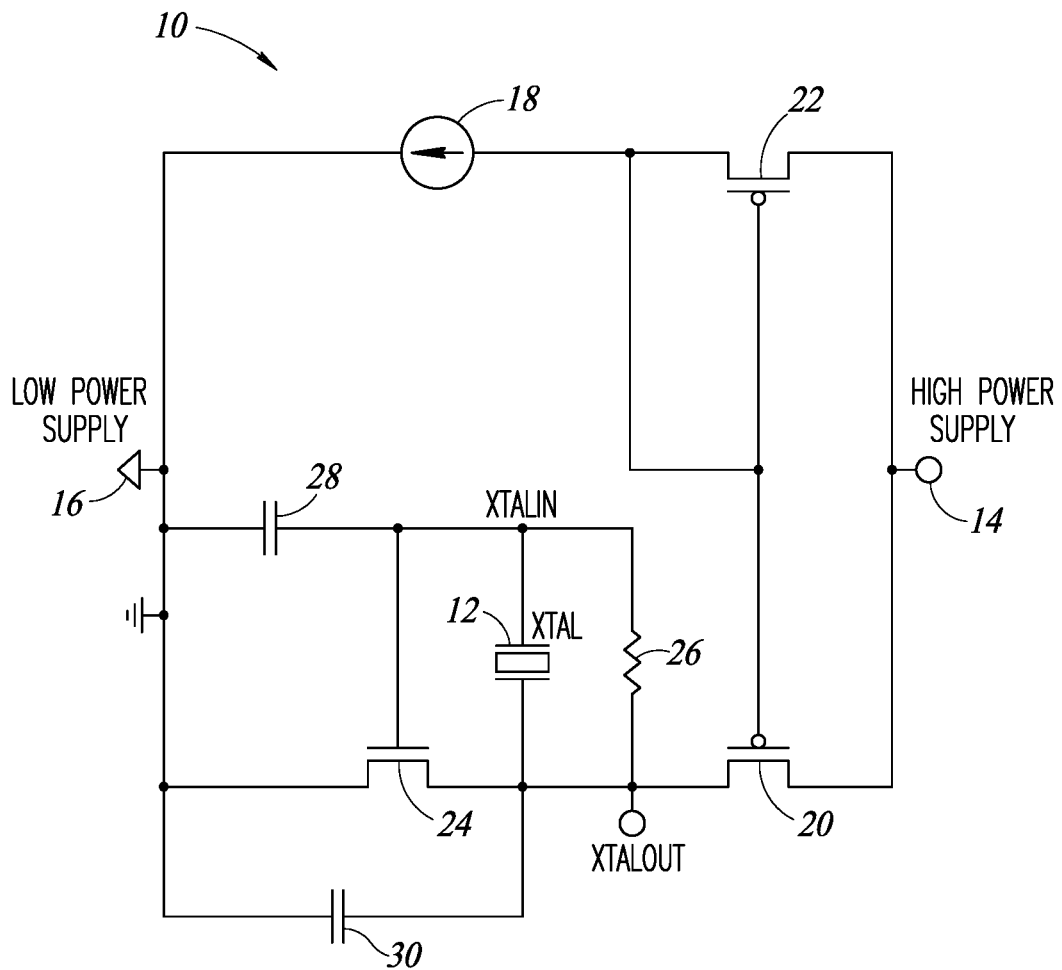
FIG. 1 shows a crystal oscillator circuit.

FIG. 1 shows a currently well known crystal oscillator circuit 10 having a crystal 12 having an input terminal XTALIN and an output terminal XTALOUT. The circuit includes a current source 18 coupled to a terminal of a first current mirror transistor 20—that is coupled to a second current mirror transistor 22. The second current mirror transistor 22 supplies a current that is a multiple of the current source 18 to drive a transistor 24. A resistor 26 is coupled in parallel to the crystal 12. A first capacitor 28 is coupled between the crystal and ground or low power supply. A second capacitor 30 is coupled between the crystal and ground.

The transistor 24 provides transconductance to start and maintain oscillation of the crystal. The resistor 26 is a bias resistor. The first capacitor 28, and the second capacitor 30 provide harmonic resonance to maintain the crystal oscillation. An output signal is measured at the crystal output terminal XTALOUT. To maintain oscillation, the transistor 24 must be operated to provide negative resistance. The higher the value of gm, the more stable the oscillator circuit operates. There exists a minimum acceptable value of gm for which a crystal oscillator is stable. However, the higher the value of gm the higher the current transistor 24 requires, resulting in higher power consumption.

The present disclosure is directed to providing an oscillating circuit that increases the effective value of gm without increasing current consumption.

Figure 2:
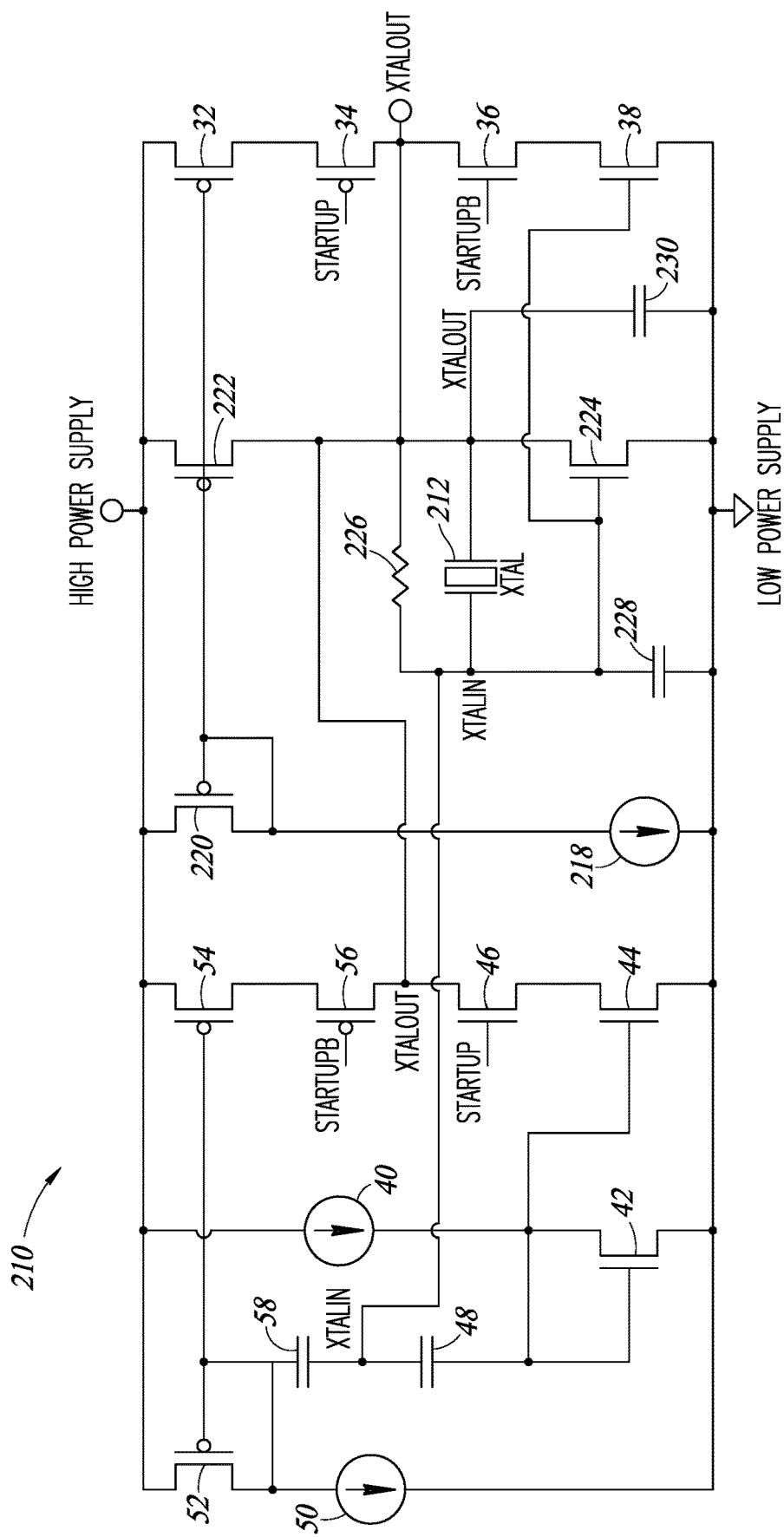
FIG. 2 shows an embodiment of a low power crystal oscillator circuit according to the present disclosure.

FIG. 2 is a low power crystal oscillator circuit 210 having a crystal 212 having an input terminal XTALIN and an output terminal XTALOUT. The circuit includes a current source 218 coupled to a terminal of a first current mirror transistor 220 which is coupled to a second current mirror transistor 222 by their gate terminals. The current source 218 will ensure that the selected current as provided by the current source passes through transistor 220. In one embodiment, a current of 1.0 nA is provided by the current source 218. The second current mirror transistor 222 supplies a current that is a multiple of the current source 218 to drive a transistor 224. The amount of current passing through transistor 222 will be amplified from the current through current source 218 based on the ratio of the W/L of transistor 222 to the W/L of transistor 220. By making the W/L of transistor 222 larger than the W/L of transistor 220, the amount of current used to drive the crystal can be larger than the value of the current source 218 by some selected amount. In various embodiments, it might be in the range of 20 to 200 times greater. A resistor 226 is coupled in parallel to the crystal 212. A first capacitor 228 is coupled between the crystal input XTALIN and a low power supply. A second capacitor 230 is coupled between the crystal output XTA-LOUT and the low power supply.

The circuit further having a third current mirror transistor 32 coupled to the first and second current mirror transistor 220, 222 by sharing their gate terminals. A first startup control transistor 34 is coupled to the third current mirror transistor 32. A second startup control transistor 36 is coupled to the first startup transistor 34. The shared terminal between the first startup transistor 34 and the second startup transistor 36 is coupled to the crystal output XTALOUT. A fourth current mirror transistor 38 is coupled between the second startup transistor 36 and the low power supply. The gate terminal of the fourth current mirror transistor is coupled to the gate terminal of transistor 224, which is also coupled to the crystal input XTALIN.

The circuit further includes a second current source 40 coupled to a fifth current mirror transistor 42, which is coupled to a sixth current mirror transistor 44 by their gate terminals. The gate terminal of the sixth current mirror transistor 44 is coupled to the crystal input XTALIN by a third capacitor 48. A third startup control transistor 46 is coupled between the sixth current mirror transistor 44 and the crystal output XTALOUT. A fourth startup control transistor 56 is coupled to the third startup control transistor 46 by both coupling to the crystal output XTALOUT. The fourth startup control transistor 56 is coupled to and powered by a seventh current mirror transistor 54.

A gate terminal of the seventh current mirror transistor is coupled to an eighth current mirror transistor 52 that is coupled to a third current source 50. A fourth capacitor 58 couples a gate terminals of the eighth current mirror transistor 52 and the seventh current mirror transistor 54 to the crystal input XTALIN of the transistor 224 which provides transconductance to start and maintain oscillation of the crystal. The resistor 226 is a bias resistor. The first capacitor 228 and second capacitor 230 provide harmonic resonance to maintain the crystal oscillation. Transistor 52 is biased by current source 50 and the value of current source 50 is much lower than the value of current source 218 that is used to start up the crystal 212 and start its initial operation. In one embodiment, the value of current source 50 is five times lower than the value of current source 218, therefore, after the crystal has been started in proper operation using the larger current based on the current source 218, the startup signal is disabled, which for a P-channel transistor 34 goes high, and the oscillation of the crystal continues based on the much lower bias current provided by current source 50.

In an embodiment, the value of the width to length ratio of the second current mirror transistor 222 is the same as that of the first current mirror transistor 220 and the transistor 224. That value is called X. In one embodiment, the width to length ratios of the third current mirror transistor 32 and the fourth current mirror transistor 38 are 200X. In other embodiments, it might be 300X or 400X. In some embodiments, the width to length ratio of the third current mirror 32 might be different from, such as larger than, the width to length ratio of the fourth current mirror transistor 38. For example, in some embodiments, the ratios might be 300X and 200X respectively, but this not the standard embodiment and in most embodiments, they have the same width to length ratios. The third current mirror transistor 32 supplies current to maintain normal operation of the first startup control transistor 34, the second startup control transistor 36 and the fourth current mirror transistor 38. A gate terminal of the first startup control transistor 34 is connected to receive a startup signal STARTUP. A gate terminal of the second startup control transistor 36 is connected to receive an inverse startup signal STARTUPB which is the logic opposite of the startup signal STARTUP. A second terminal of the first startup control transistor 34 is connected to a second terminal of the second startup control transistor 36. The second terminal of the first startup control transistor 34 and the second terminal of the second startup control transistor 36 are coupled with the crystal output XTALOUT.

The pair of first and second startup control transistors 34 and 36 operates as a logical switch. When startup voltage at STARTUP is at the value of logic low, the fourth current mirror transistor 38 is coupled to XTALOUT and provides transconductance to the crystal 12 in addition to the transistor 224. The third current mirror transistor 32 is uncoupled to XTALOUT. When startup voltage at STARTUP is at the value of logic high, the fourth current mirror transistor 38 is uncoupled from XTALOUT and becomes inactive.

In one embodiment, the width to length ratios of the sixth current mirror transistor 44 and the seventh current mirror transistor 54 are smaller than those of the third current mirror transistor 32 and the fourth current mirror transistor 38. In particular, the value of the width to length ratios of the sixth and seventh current mirror transistors 44 and 54 in one embodiment are both 40Y. The width to length ratio of the fifth current mirror transistor 42 is Y.

The gate terminal of the fifth current mirror transistor 42 is connected to a second terminal of the fifth current mirror transistor 42. The second terminal of the fifth current mirror transistor 42 is coupled to the second current source 40. The gate terminal of the sixth current mirror transistor 44 is coupled to the gate terminal of the fifth current mirror transistor 42. The gate terminal of the sixth current mirror transistor 44 is coupled to a first terminal of the third capacitor 48. A second terminal of the third capacitor 48 connects to the crystal input terminal XTALIN. The width to length ratio of the eighth current mirror transistor 52 is X. The gate terminal of the eighth current mirror transistor 52 is connected to a second terminal of the eighth current mirror transistor 52. The second terminal of the eighth current mirror transistor 52 is coupled to the third current source 50. The gate terminal of the seventh current mirror transistor 54 is coupled to a first terminal of the fourth capacitor 58.

A second terminal of the fourth capacitor 58 connects to the crystal input terminal XTALIN. A gate terminal of the third startup control transistor 46 is connected to receive the startup signal STARTUP. A gate terminal of the fourth startup control transistor 56 is connected to receive the inverse startup signal STARTUPB. A second terminal of the third startup control transistor 46 is connected to a second terminal of the fourth startup control transistor 56. The second terminal of the fourth startup control transistor 56 and the second terminal of the third startup control transistor 46 are coupled with the crystal output XTALOUT. A third terminal of the fourth startup control transistor 56 is connected to a second terminal of the seventh current mirror transistor 54. A third terminal of the third startup control transistor 46 is connected to a second terminal of the sixth current mirror transistor 44.

The pair of the third and fourth startup control transistors 46 and 56 operates as a logical switch. When startup voltage at STARTUP is at the value of logic high, the sixth current mirror transistor 44 and the seventh current mirror transistor 54 are coupled to XTALOUT via the third capacitor 48 and the fourth capacitor 58 and provide extra transconductance to the crystal 12. When startup voltage is at the value of logic low, the sixth current mirror transistor 44 and the seventh current mirror transistor 54 become inactive. Transconductance required for operation of the crystal 12 is less than that required for starting up oscillation. Transistors 52 and 42 are biased by current sources 50 and 40, respectively. The value of these current sources 50 and 40 is much lower than the value of current source 218 that is used to start up the crystal 212 and start its initial operation. Therefore, much lower power is expended to drive the crystal 212 after the startup phase.

In one embodiment, the value of current sources 40 and 50 is five times lower than the value of current source 218, therefore, after the crystal has been started in proper operation using the larger current based on the current source 218, the startup signal is disabled, which for a P-channel transistor 34 goes high, and the oscillation of the crystal continues based on the much lower bias current provided by current sources 40 and 50.

In some embodiments, but not in all, another way of using lower power to drive the crystal 212 after start up can be achieved. In these other embodiments, the ratio of the W/L of the seventh current mirror transistor 54 to the W/L of transistor 52 can be less than the ratio of the W/L of transistor 32 to the transistor 220. Similarly, the ratio of the W/L of the sixth current mirror transistor 44 to the W/L of transistor 42 can be less than the ratio of the W/L of transistor 32 to the transistor 220. Therefore the bias current provided by current source 50 (and current source 40, if present) is not amplified as much as the bias current provided by current source 218. In some embodiments, this can be another design choice to cause the current consumption to be less when the crystal oscillator circuit 210 operates after startup mode ends.

Transconductance is only required for an AC signal during oscillation. The sixth current mirror transistor 44 and the seventh current mirror transistor 54 are DC-isolated by the third capacitor 48 and the fourth capacitor 58, which further reduces the voltage, and therefore the power consumption of the crystal after start up.

As noted above, in one embodiment the first current source 218 supplies a current of 1.0 nA and the second and third current source 40 and 50 each supply a current of 0.2 nA.

Figure 3:
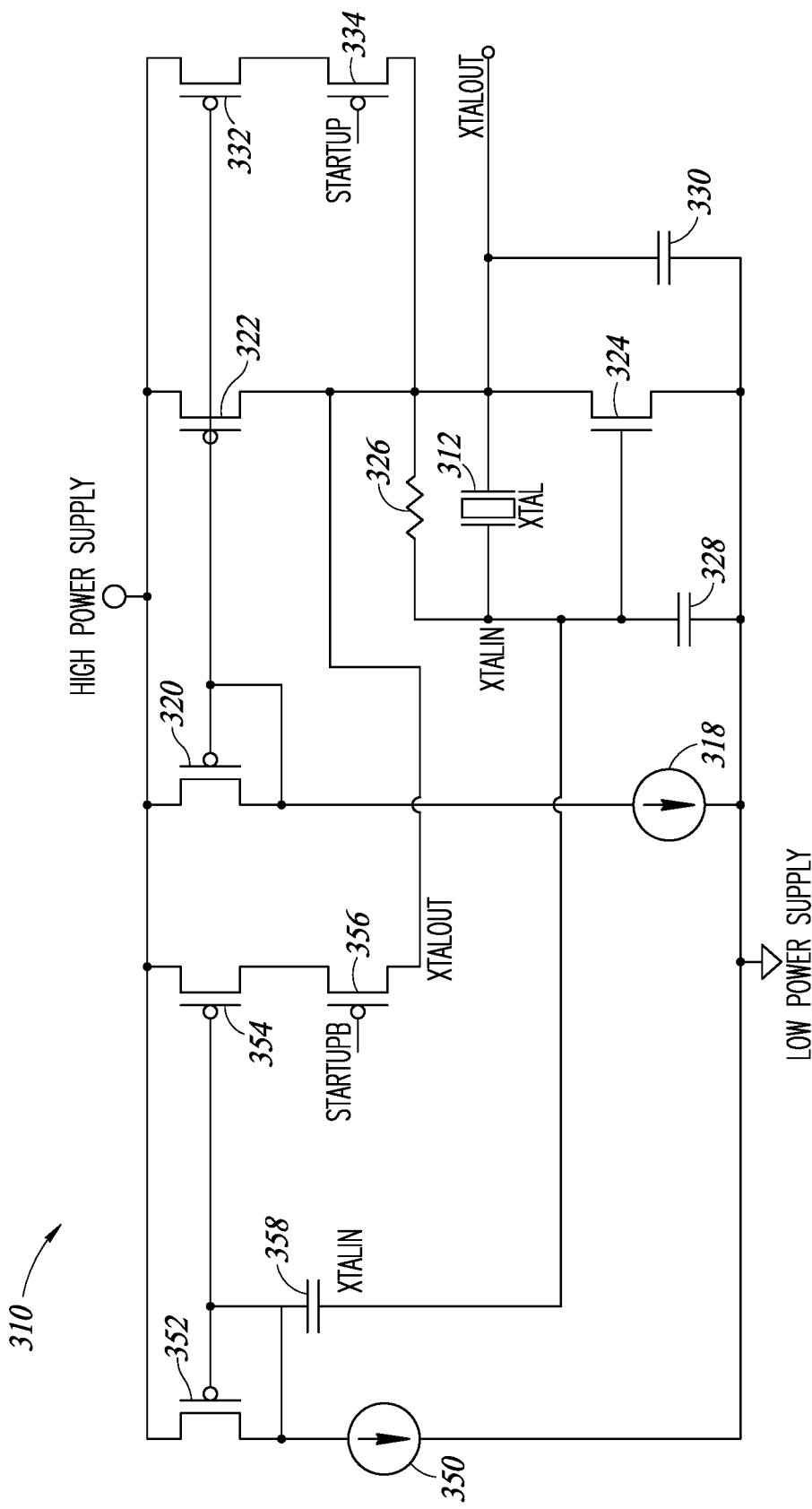
FIG. 3 shows an alternative embodiment of a low power crystal oscillator circuit.

FIG. 3 is another embodiment of a low power crystal oscillator circuit 310 that includes a crystal 312 coupled between an input XTALIN and an output XTALOUT. A first transistor 324 is coupled between XTALOUT and a low power supply, which may be a ground. A resistor 326 is coupled in parallel between the input and output of the crystal 312. A first capacitor 328 is coupled between the crystal input XTALIN and the low power supply. A second capacitor 330 is coupled between the crystal output XTALOUT and the low power supply. A gate terminal of the first transistor 324 is coupled to the crystal input. The first transistor 324 provides transconductance to the crystal 312 during operation of the oscillator circuit.

A first current source 318 is coupled to provide the bias current for a first current mirror transistor 320. A gate terminal of the first current mirror transistor 320 is coupled to a second terminal of the first current mirror transistor 320. The gate terminal of the first current mirror transistor 320 is coupled to a gate terminal of a second current mirror transistor 322. A second terminal of the second current mirror transistor is coupled to the crystal output and a second terminal of the first transistor 324. The second current mirror transistor 322 provides a current that is a multiple of that of the first current source 318 to provide power and maintain operation of the first transistor 324 and aid to drive the crystal 312 in the startup mode when it begins its oscillation.

A third current mirror transistor 332 is also coupled to the first current mirror transistor 320. A gate terminal of the third current mirror transistor 332 is coupled to the gate terminal of the second current mirror transistor 322. A first startup control transistor 334 is coupled to the third current mirror transistor 332. A gate terminal of the first startup control transistor is coupled to receive a startup signal STARTUP. A first terminal of the first startup control transistor is coupled to a first terminal of the third current mirror transistor 332. A second terminal of the first startup control transistor 334 is coupled to the crystal output XTALOUT. The third current mirror transistor 332 provides a current that is a multiple of the current supplied by the first current mirror transistor 320 to provide power to the first startup control transistor 334.

A second current source 350 is coupled to provide the bias current for a fourth current mirror transistor 352. A gate terminal of the fourth current mirror transistor is coupled to a first terminal of the fourth current mirror transistor 352. The first terminal of the fourth current mirror transistor 352 is coupled to a terminal of the second current source 350. The gate terminal of the fourth current mirror transistor 352 is coupled to a gate terminal of a fifth current mirror transistor 354. A first terminal of the fifth current mirror transistor is coupled to a first terminal of a second startup control transistor 356. A second terminal of the second startup control transistor 356 is coupled to the crystal output XTALOUT. A gate terminal of the second startup control transistor is coupled to receive an inverse startup signal STARTUPB which is the logical opposite of the startup signal STARTUP.

A third capacitor 358 couples the gate terminals of the fourth and fifth current mirror transistors 352 and 354 to the crystal input XTALIN.

The first and second startup control transistors 334 and 356 work as logical switches. When the startup signal STARTUP has a voltage of logic low, meaning the inverse startup signal STARTUPB ha a voltage of logic high, the third current mirror transistor is coupled to the crystal output XTALOUT and provides transconductance in addition to the transconductance supplied by the first transistor 324. When the startup signal STARTUP has a value of logic high, meaning the inverse startup signal STARTUPB has a voltage of logic low, the third current mirror transistor 332 is uncoupled from the crystal output XTALOUT and the fifth current mirror transistor 354 is coupled to the crystal output XTALOUT to provide transconductance.

In one embodiment, the width to length ratio of the first and second current mirror transistor 322 and 332 has the value of X. The width to length ratio of the third current mirror transistor 332 has the value of 200X. This means that the third current mirror transistor 332 carries a current 200 times that of the first current source 318. The fourth current mirror transistor 352 has a width to length ratio of X and the fifth current mirror transistor 354 has a width to length ratio of 40X, which is smaller than that of the third current mirror transistor. In one embodiment, the first current source 318 supplies a current of 1.0 nA and the second current source 350 supplies a current of 0.2 nA.

The transconductance required for operation of the crystal 312 is less than that required for starting up oscillation. Having a smaller width to length ratio means that current consumption is less to operate the fifth current mirror transistor 354 than the third current mirror transistor 332. The crystal oscillator circuit can initialize oscillation at startup with higher power consumption and maintain low power consumption after startup.

Transconductance is only required for an AC signal during oscillation. The fifth current mirror transistor 354 are DC-isolated by the third capacitor 358, which further reduces power consumption required for DC gain on the fifth current mirror transistor 354.

Figure 4A:
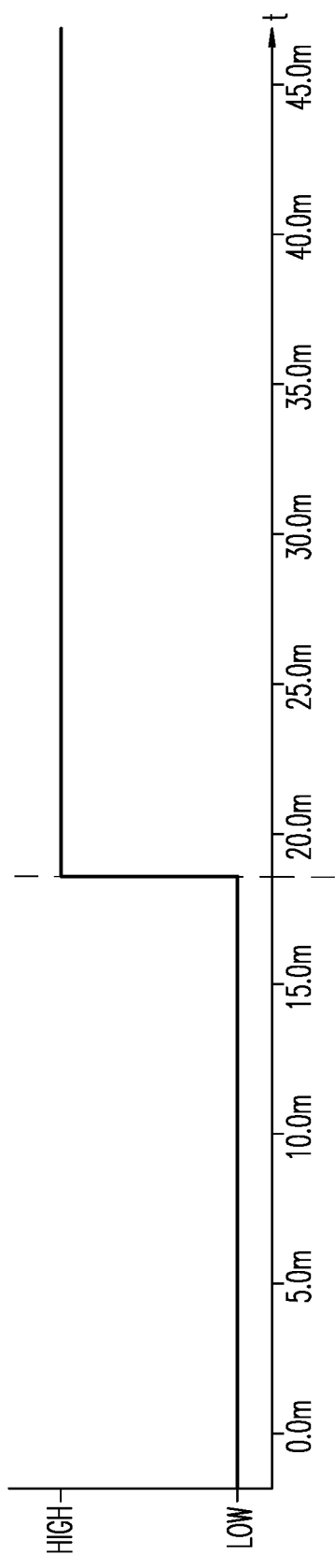

FIG. 4A shows the voltage level of the startup signal with respect to time. Startup is initially at logic low. At 18 ms, startup is set to logic high.

Figure 4B:
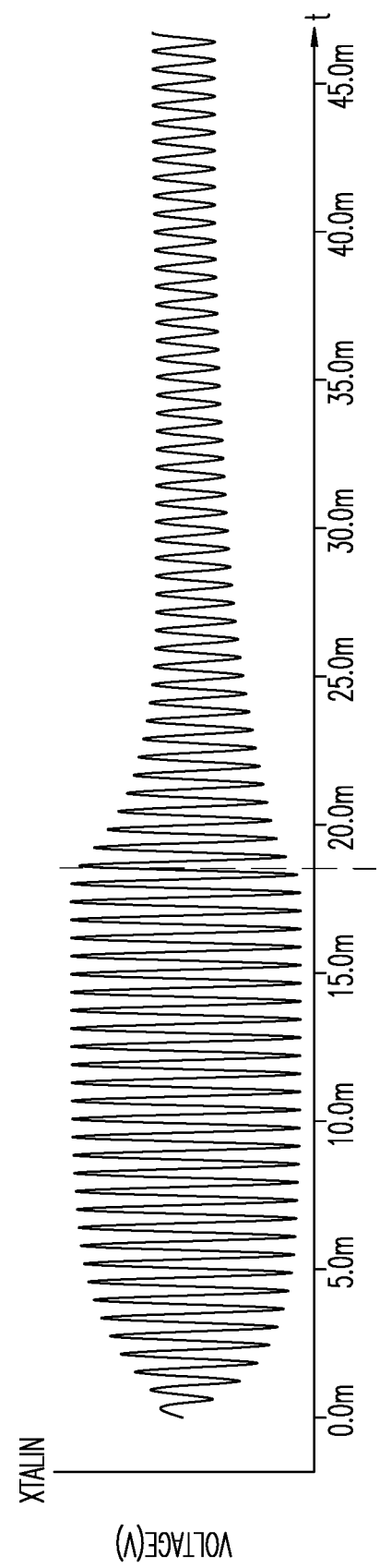

FIG. 4B shows the voltage measured at the crystal input node XTALIN with respect to time. The crystal 212 starts oscillating once power is applied. Oscillation is stable by about 8 ms and remains fully stable for another 10 ms, until at about 18 ms the startup signal is disable, as this circuit is brought to logic high level. At time, the current used the drive the crystal 212 is provide based on the current source 50 in the embodiment of FIG. 2 or the current source 350 in the embodiment of FIG. 3. The current sources 218 and 318 of FIGS. 2 and 3, respectively, are turned off and the total current consumed by the crystal is much lower. The amount of current consumed is now based on the current source 50 (or 350), which is much lower than the value of the current source 218 (or 318). By driving the crystal 212 (or 312) based on a lower biasing current from a different current source after start up and shutting off the startup current source and it associate current mirror, substantial power is saved.

The voltage at XTALIN also reduces as the circuit transitions to operate with low power. The circuit reaches stable oscillation with a reduced voltage around 35 ms at the lower voltage, as can be seen in FIGS. 4B and 4C. In preferred embodiments, the voltage output at long term stable operation is half the voltage at start-up. This can be seen by looking at the relative reduction in voltage in FIGS. 4B and 4C from startup to after the startup is completed. FIG. 4C shows the voltage measured at the crystal input node XTALOUT with respect to time. Similar to FIG. 4B, the voltage output is high at startup. Once the startup signal is brought to logic high, the output voltage at XTALOUT reduced as the crystal oscillator circuit transitions to stable operation with low power.

The power consumed by a circuit is a multiple of the current and voltage, P=IV. Since the current is greatly reduced after start up and the voltage is also reduced, the total power is significantly reduced. In one embodiment, the current consumed by the crystal circuit during the standard operation mode, after startup, is reduced by 20 to 25 times the current used during the startup mode. Further, the voltage is reduced by about half, so the total power consumed will be in the range of 40 to 50 times less during standard operation mode than in startup mode. In other embodiments, the reduction in power can be two orders of magnitude, namely about 100 times from the startup mode to standard operation mode. This can be obtained based on the selection of value of the current sources used to bias the circuit during start up as compared to the value of the current source used to bias the circuit during standard operation mode, together with selection of the relative transistor ratios of transistors in the respective current mirrors.

FIG. 4D1 shows the current consumption of the embodiment presented in FIG. 3. Initially the current consumption is around 1.0 nA. Once startup is brought to high, transistor 332 shuts off and the circuit switches to low power mode, operating with transistor 354, consuming only 0.4 nA.

FIG. 4D2 shows the current consumption of the embodiment presented in FIG. 2. Initially the current consumption is around 1.0 nA. Once startup is brought to high, transistor 32 and transistor 38 shut off and the circuit switches to low power mode, operating with transistor 44 and transistor 54, consuming only 0.2 nA.

Figure 4E:
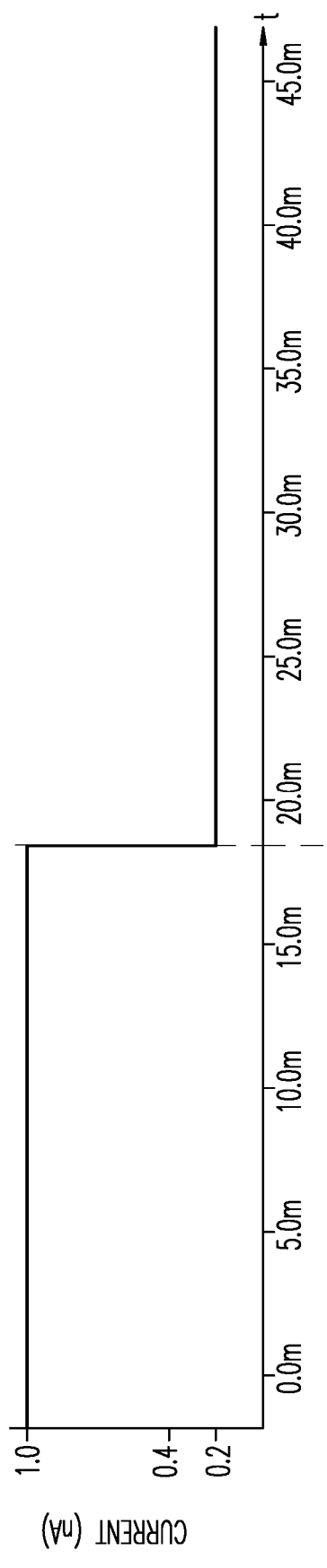
Figure 4E:
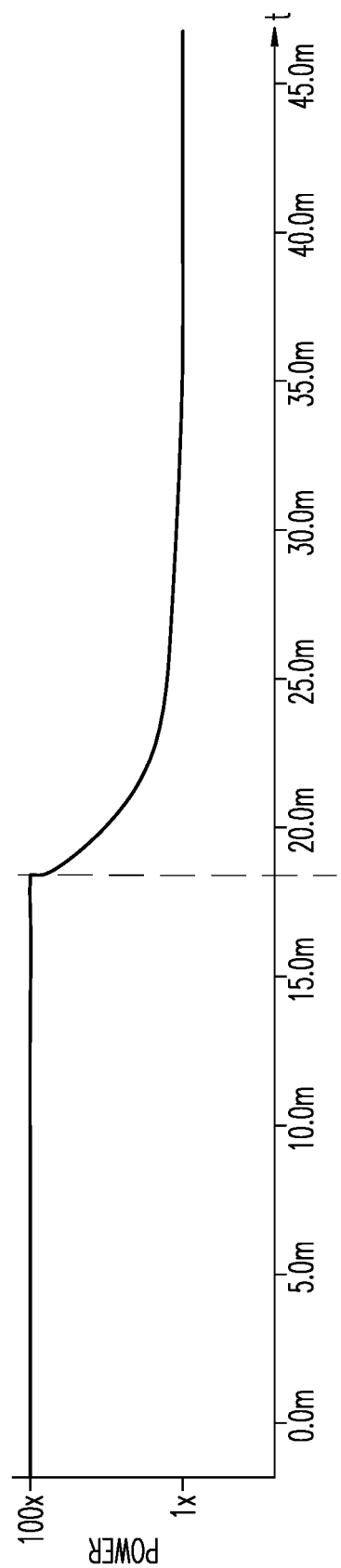

FIG. 4E shows a typical power consumption of the low power crystal oscillator circuit presented in this application. The stable operation power consumption is 100 times less than the startup power consumption.

Figure 5:
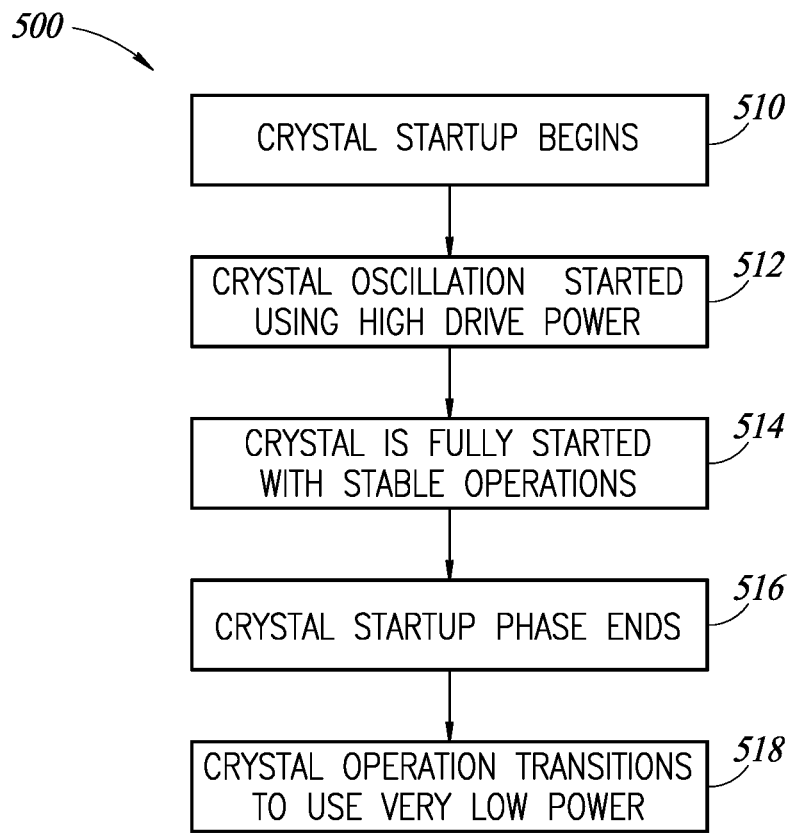
FIG. 5 shows the various phases the low power crystal oscillator circuit operates.

FIG. 5 shows a flow chart 500 of the various phases a low power crystal oscillator circuit operates. At a step 510, a startup signal is set with a voltage level of logic low. At a step 512, the crystal oscillator circuit operates using high power. At a step 514, the crystal reaches stable oscillation. At a step 516, the startup phase ends and the startup signal is set to a voltage level of logic high. At a step 518, the crystal oscillator transitions to use very low power to maintain operation.

Figure 6:
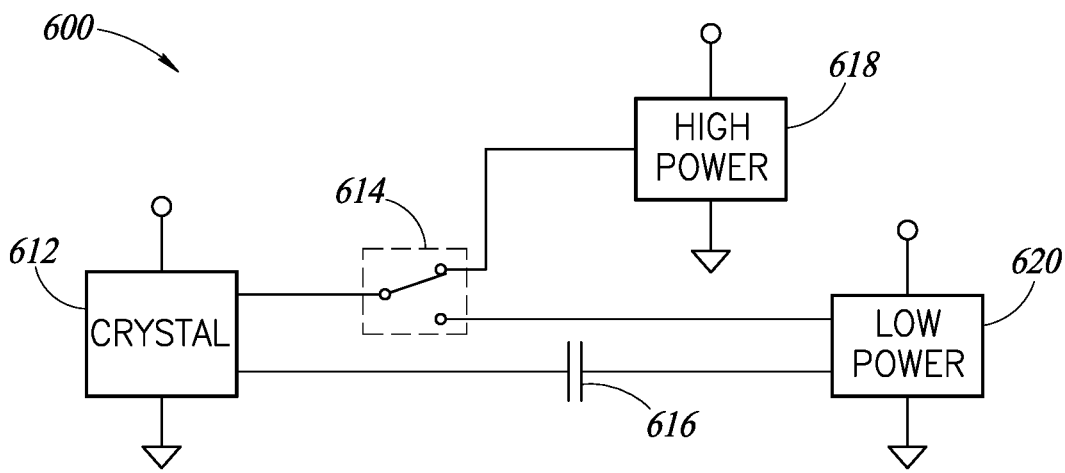
FIG. 6 is a schematic block diagram of a low power crystal oscillator circuit according to the present disclosure.

FIG. 6 shows a schematic block diagram of a low power crystal oscillator circuit 600 according to the present disclosure. A crystal 612 is coupled to a switch 614. The switch 614 couples the crystal 612 to a high power circuit 618 or a low power circuit 620. The low power circuit 620 is also coupled to the crystal 612 by a capacitor 616. The high power circuit 618 and low power circuit 620 are configured to provide transconductance for the operation of the oscillator circuit. The capacitor 616 further DC-isolates the low power circuit 620 during operation of the oscillator.

In one embodiment the switch 614 comprises a plurality of startup control transistors which are configured to receive a startup signal and an inverse startup signal. In one embodiment, the high power circuit 618 and the low power circuit 620 utilize current mirror transistors of different width to length ratios to regulate power consumption. In one embodiment, the low power circuit 620 is DC coupled to the crystal 612 by the switch 614, but also AC coupled to the crystal 612 by capacitor 616.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A low power crystal oscillator circuit, comprising:
a crystal having an input terminal and an output terminal;
a high power supply;
a low power supply;
a first capacitor having a first terminal coupled to the crystal input terminal and a second terminal coupled to the low power supply;
a first current mirror transistor having a first terminal coupled to the high power supply and a gate terminal coupled to a second terminal of the first current mirror transistor, the first current mirror transistor having a channel with a first width to length ratio;

a first current source outputting current of a first value, the first current source having a first terminal coupled to the second terminal of the first current mirror transistor and a second terminal coupled to the low power supply;

a second current mirror transistor having a first terminal coupled to the high power supply and a gate coupled to the gate terminal of the first current mirror transistor and a second terminal, the second current mirror transistor having a second width to length ratio that is X times greater than the first width to length ratio;

a first startup control transistor having a first terminal coupled to the second terminal of the second current mirror transistor, a gate terminal configured to receive a startup control signal and a second terminal coupled to the crystal output terminal;

a third current mirror transistor having a first terminal coupled to the high power supply and a gate terminal coupled to a second terminal of the third current mirror transistor, the third current mirror transistor having a third width to length ratio;

a second current source outputting current of a second value, the second current source having a first terminal coupled to the second terminal of the third current mirror transistor and a second terminal coupled to the low power supply, the current of the second value being less than the current of the first value;

a fourth current mirror transistor having a first terminal coupled to the high power supply, a gate coupled to the gate terminal of the third current mirror transistor and a second terminal, the fourth current mirror transistor having a fourth width to length ratio that is Y times greater than the third width to length ratio;

a second startup control transistor having a first terminal coupled to the second terminal of the fourth current mirror transistor, a gate terminal configured to receive an inverse startup control signal and a second terminal coupled to the crystal output terminal; and a third capacitor having a first terminal coupled to the gates of the third and fourth current mirror transistors and a second terminal coupled to the input terminal of the crystal.

2. The low power crystal oscillator circuit of claim 1 wherein the value X is greater than 100.

3. The low power crystal oscillator circuit of claim 1 wherein the value Y is less than 50.

4. The low power crystal oscillator circuit of claim 1 wherein the value X is 5 times larger than the value Y.

5. The low power crystal oscillator of claim 1 wherein the second current value output by the second current source is much less than the first current value output by the first current source.

6. The low power crystal oscillator circuit of claim 1, further comprising:
a fifth current mirror transistor having a first terminal coupled to the low power supply, a gate terminal coupled to a second terminal of the fifth current mirror transistor, the fifth current mirror transistor having a fifth width to length ratio;
a third current source outputting current of a third value, the third current source having a first terminal coupled to the second terminal of the fifth current mirror transistor and a second terminal coupled to the high power supply; and
a fourth capacitor having a first terminal coupled to the crystal input terminal and a second terminal coupled to the gate terminal of the fifth current mirror transistor.

7. The low power crystal oscillator circuit of claim 6 wherein the fifth width to length ratio is the same as the third width to length ratio.

8. The low power crystal oscillator circuit of claim 6, further comprising:
a third startup control transistor having a first terminal coupled to the crystal output terminal, a second terminal and a gate terminal configured to receive the inverse startup control;
a sixth current mirror transistor having a first terminal coupled to the low power supply, a gate terminal coupled to the crystal output terminal and a second terminal coupled to the second terminal of the third startup control transistor, the sixth current mirror transistor having a channel with a fourth width to length ratio that is Z times greater than the first width to length ratio;
a fourth startup control transistor having a first terminal coupled to the crystal output terminal, a second terminal and a gate terminal configured to receive the startup control; and
a seventh current mirror transistor having a first terminal coupled to the low power supply, a gate terminal coupled to the gate terminal of the fifth current mirror transistor and a second terminal coupled to the second terminal of the fourth startup control transistor, the seventh current mirror transistor having a channel with a fifth width to length ratio that is W times greater than the fifth width to length ratio.

9. The low power crystal oscillator of claim 8 wherein the value W is the same as a value Y.

10. The low power crystal oscillator of claim 8 wherein the value W is less than 50.

11. The low power crystal oscillator of claim 8 wherein the value Z is the same as a value X.

12. The low power crystal oscillator of claim 8 wherein the value Z is greater than 100.

13. A device, comprising:
a crystal oscillator circuit having:
an output terminal;
a first current supply, the crystal oscillator circuit configured to receive a startup signal of a first polarity to a startup terminal for a first period of time;
a first current mirror having first and second current mirror transistors, the first current mirror transistor having a width to length ratio that is over one hundred times greater than a width to length ratio of the second current mirror transistor in the first current mirror, after the first period of time, the crystal oscillator circuit is configured to receive the startup signal with a reversed polarity from the first polarity;
a second current supply;
a second current mirror having third and fourth current mirror transistors, the second current supply coupled to the third current mirror transistor.

14. The device of claim 13 wherein in response to the reversed polarity, the first current mirror is configured to turn off.

15. The device of claim 14 wherein the crystal oscillator circuit is configured to be driven with a current of a first amperage and with a current of a second amperage, the second amperage value is J times less than the first amperage and the crystal oscillator circuit outputs voltage of a second voltage value which is K times less than the first voltage value at the output terminal.

16. The device of claim 15 wherein the value J is greater than 2 and the value K is greater than 2.

17. A low power crystal oscillator circuit, comprising:
a crystal;
a high power supply;
a low power supply;
a first capacitor coupled to the crystal and coupled to the low power supply;
a first current mirror transistor coupled to the high power supply and, the first current mirror transistor having a channel with a first width to length ratio;
a first current source outputting current of a first value, the first current source coupled to the first current mirror transistor and coupled to the low power supply;
a second current mirror transistor coupled to the high power supply and the first current mirror transistor, the second current mirror transistor having a second width to length ratio that is X times greater than the first width to length ratio;
a first startup control transistor coupled to the second current mirror transistor and coupled to the crystal;
a third current mirror transistor coupled to the high power supply, the third current mirror transistor having a third width to length ratio; and
a second current source coupled to the third current mirror transistor and the low power supply.

18. The low power crystal oscillator circuit of claim 17, comprising a fourth current mirror transistor coupled to the high power supply, the fourth current mirror transistor having a fourth width to length ratio that is Y times greater than the third width to length ratio.

19. The low power crystal oscillator circuit of claim 18, comprising:
a second startup control transistor coupled to the fourth current mirror transistor and coupled to the crystal; and
a third capacitor coupled to the third and fourth current mirror transistors and the crystal.

* * * * *

UNITED STATES PATENT AND TRADEMARK OFFICE
CERTIFICATE OF CORRECTION

PATENT NO. : 11,901,865 B2
APPLICATION NO. : 17/931863
DATED : February 13, 2024
INVENTOR(S) : Anand Kumar et al.

Page 1 of 1

It is certified that error appears in the above-identified patent and that said Letters Patent is hereby corrected as shown below:

In the Claims

Column 9, Claim 1, Line 3:
"mirror transi sior" should read: --mirror transistor--.

Signed and Sealed this
Seventh Day of May, 2024

Katherine Kelly Vidal
*Director of the United States Patent and Trademark Office*